United States Patent
Ehrenreich et al.

(10) Patent No.: US 7,414,904 B2
(45) Date of Patent: Aug. 19, 2008

(54) METHOD FOR EVALUATING STORAGE CELL DESIGN USING A WORDLINE TIMING AND CELL ACCESS DETECTION CIRCUIT

(75) Inventors: Sebastian Ehrenreich, Schoenau (DE); Jente B Kuang, Austin, TX (US); Chun-Tao Li, Rochester, MN (US); Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/609,598

(22) Filed: Dec. 12, 2006

(65) Prior Publication Data

US 2008/0137455 A1    Jun. 12, 2008

(51) Int. Cl.
G11C 7/00    (2006.01)

(52) U.S. Cl. .................... 365/201; 365/194; 714/718

(58) Field of Classification Search .............. 365/201, 365/194, 230.06; 714/718, 719, 814
See application file for complete search history.

(56) References Cited

U.S. PATENT DOCUMENTS

| | | | |
|---|---|---|---|
| 5,781,469 | A | 7/1998 | Pathak et al. |
| 5,870,404 | A | 2/1999 | Ferraiolo et al. |
| 6,538,522 | B1 | 10/2001 | Aipperspach et al. |
| 6,452,459 | B1 | 9/2002 | Chan et al. |
| 6,909,301 | B2 | 9/2002 | Korson et al. |
| 7,046,094 | B2 | 3/2004 | Belluomini et al. |
| 6,958,659 | B2 | 10/2005 | Nakajima |
| 7,071,736 | B2 | 7/2006 | Wikstrom |
| 7,190,233 | B2 | 3/2007 | Bhushan et al. |
| 2002/0135343 | A1 | 9/2002 | Underbrink et al. |
| 2004/0061561 | A1 | 4/2004 | Monzel et al. |
| 2005/0063232 | A1 | 3/2005 | Chan et al. |
| 2005/0078508 | A1 | 4/2005 | Chan et al. |
| 2005/0204211 | A1 | 9/2005 | Gouin et al. |
| 2005/0213371 | A1* | 9/2005 | Kimura ................ 365/154 |

(Continued)

FOREIGN PATENT DOCUMENTS

JP    09294055 A    11/1997

(Continued)

OTHER PUBLICATIONS

U.S. Appl. No. 11/225,652, filed Sep. 13, 2005, Joshi et al.

(Continued)

*Primary Examiner*—Huan Hoang
*Assistant Examiner*—Fernando N Hidalgo
(74) *Attorney, Agent, or Firm*—Mitch Harris, Atty at Law, LLC; Andrew M. Harris; Casimer K. Salys (57) ABSTRACT

A method for storage cell design evaluation provides accurate information about state changes in static storage cells. A wordline select pulse is propagated along the wordline select path of the test row to an output driver circuit, in order to test the clock and/or address timing of the row, so that variation of access timing, read stability and writeability with wordline strength/access voltage can be determined. An access detection cell holds the input of the output driver circuit until a simulated access operation activated by the wordline select pulse is complete. Multiple test rows may be cascaded among columns to provide a long delay line or ring oscillator for improved measurement resolution.

2 Claims, 7 Drawing Sheets

U.S. PATENT DOCUMENTS

2006/0050600 A1 3/2006 Venkatraman et al.
2006/0097802 A1 5/2006 Chan et al.

OTHER PUBLICATIONS

U.S. Appl. No. 11/250,019, filed Oct. 13, 2005, Joshi et al.
U.S. Appl. No. 11/250,061, filed Oct. 13, 2005, Kuang et al.
U.S. Appl. No. 11/260,571, filed Oct. 27, 2005, Chuang et al.
U.S. Appl. No. 11/549,138, filed Oct. 13, 2006, Carpenter et al.
U.S. Appl. No. 11/559,436, filed Nov. 14, 2006, Carpenter et al.
U.S. Appl. No. 11/609,598, filed Dec. 12, 2006, Ehrenreich et al.
U.S. Appl. No. 11/682,542, filed Mar. 6, 2007, Carpenter et al.
U.S. Appl. No. 11/781,994, filed Jul. 24, 2007, Kuang et al.

* cited by examiner

METHOD FOR EVALUATING STORAGE CELL DESIGN USING A WORDLINE TIMING AND CELL ACCESS DETECTION CIRCUIT

This invention was made with government support under DARPA, PERCSII, NBCH3039004. THE GOVERNMENT HAS CERTAIN RIGHTS IN THIS INVENTION.

BACKGROUND OF THE INVENTION

1. Technical Field

The present invention relates generally to memory design evaluation circuits, and more particularly to a memory circuit having a mimicking cell that accurately reflects internal state changes of a memory cell.

2. Description of the Related Art

Storage cell speed, circuit area and environmental operating ranges, e.g., supply voltage and temperature range, are critical limitations in today's processing systems and are predicted to become even more of a critical limitation as technologies move forward. In particular, static random access memory (SRAM) cells are used in processor caches and external storage to provide fast access to data and program instructions. Static storage cells are also used within processors and other digital circuits for storing values internally, for example, in processor registers.

With processor cycle frequencies reaching well above 4 Ghz, development of SHAM cells that can store and provide access to stored values within that period has become necessary. However, actually measuring the internal writeability and write timing margins of memory cells presents a challenge. In a typical storage cell, there is no mechanism for determining writeability and write timing margin, except for empirical evaluation performed by reading the cells after performing write operations under various conditions. If a probe is used to attempt to measure the internal result and timing of a write operation, the probe alters the timing of the cell, yielding incorrect results.

Memory cell transition times involving bitline read operations, sometimes in combination with write operations, have been evaluated using ring oscillator circuits or cascaded cell delay circuits wherein a large number of cells are cascaded. A ring oscillator may be formed with feedback of an output of the last cell to an input of the first cell, or a one-shot delay may be measured through the cascade of cells. The frequency at which the ring oscillator operates or the one-shot delay indicates the transition time performance, which provides some measure of ultimate operating frequency and access times. Typically, the cell design is then changed in subsequent design iterations having parameters adjusted in response to the results of the ring oscillator test.

However, present ring oscillator circuits and other delay-oriented circuits for performing delay tests typically either are not applied on production dies or they do not test the actual storage cells under wordline loading conditions identical to placement of the cells within an array. Further, write cycle measurements are not measured independently, since the inclusion of a cell in the oscillator ring or delay line requires that the cell value will be read in some manner to provide input to the next cell.

It is therefore desirable to provide a test circuit and method for accurately measuring wordline transition times under the complete row loading conditions of an actual array. It would further be desirable to measure access (pass) transistor drive time and internal write state/write timing of a storage cell under actual loading conditions. It is further desirable to provide such a test circuit that can be integrated within a production storage device.

SUMMARY OF THE INVENTION

The objective of accurately determining wordline timing including the effect of access transistor drive, as well as the internal written state/write timing of a storage cell design under actual loading conditions, is accomplished in a method and circuit.

The circuit replicates or is integrated within a row of a storage array. A special access timing detection cell is provided as one of the cells in the row, and includes loading circuits that duplicate the actual loading during at least one of the internal transitions of the storage cell in response to a write operation or other access operation. The overall timing is determined from an address input to the array to an output of the detection cell and the detection cells can be cascaded along one or more columns of the array to form a delay line or ring oscillator. The wordline loading of the cell can be made identical to that of an actual wordline.

The access detection cell is coupled to a row sense/output circuit, so that a low impedance output is be provided for measurement without altering the loading. The access detection cell may be formed from a modified 6T, or multiple-ported SRAM cell, in which one of the normally cross-coupled connections to one of the gate latch transistors is instead coupled to a properly-sized output probe drive transistor. The wordline driver may have a separate power supply, so that the required strength of the wordline driver and drive voltage can be evaluated. Evaluation can be made of write timing versus clock and/or address by fixing one of the clock or address signals and using the other as the stimulus signal, e.g., as the signal carrying the ring oscillator or delay line signal path in cascaded configurations.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a test circuit for evaluating access performance of storage cells, e.g., registers or static memory cells, in order to facilitate design improvement and determination of operating and margins. The test circuit provides for characterizing wordline timing, including operation of access (pass) transistors under degraded drive conditions. A special sense circuit cell is incorporated into a row circuit and mimics the internal and external loading of a regular cell in an array. The sense circuit further provides an output that accurately reflects at least one of the state changes within the sense circuit cell caused by a write operation, so that write timing and writeability can be determined for an actual memory cell under actual operating conditions. Multiple rows in an array can be cascaded by connecting the output of the sensing circuit of each row to the wordline driver input of the next row to form a delay chain. The output of the last wordline can be connected to the first, to form a ring oscillator. The loading experienced by the cells in the oscillator is identical to that of an ordinary storage row, providing an accurate measure of the delays of the storage cells in an actual array implementation. A test die may be implemented that includes the test circuit permanently wired-in-place, or a sacrificial metal can be used to implement the circuit on a production wafer, which can then be modified into an operational circuit via a permanent metal layer that replaces the sacrificial layer. A storage array according to the present invention may also alternatively be implemented on the wafer kerf and discarded after testing. Alternatively, the ring oscillator or delay measurement circuit of the present invention can be selectively enabled in a test mode.

Figure 1A:
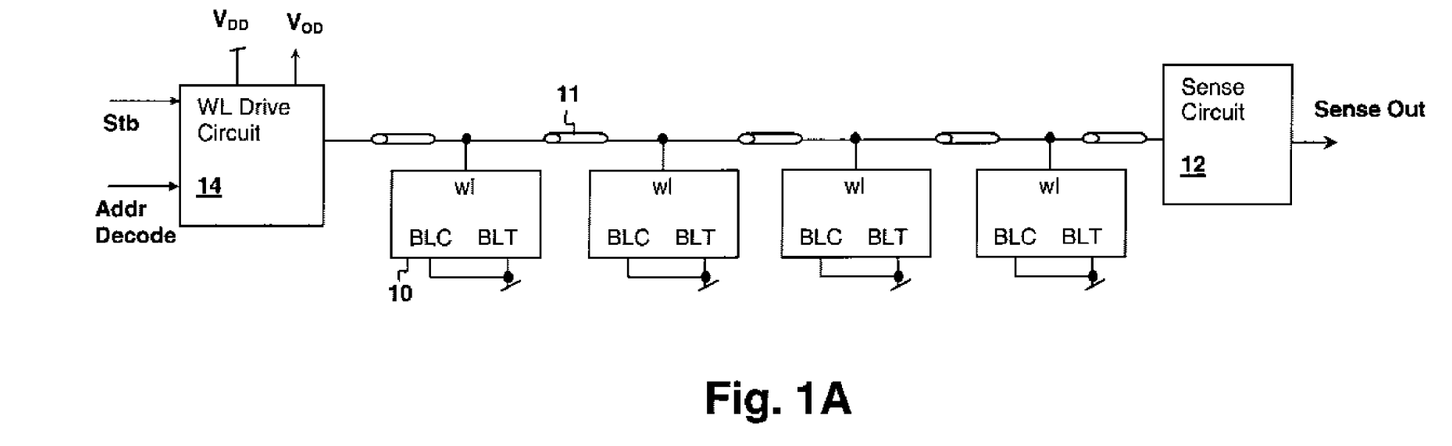
FIG. 1A is a simplified schematic diagram of a memory cell test row in accordance with an embodiment of the invention.

With reference now to the figures, and in particular with reference to FIG. 1A, a storage array row circuit in accordance with an embodiment of the invention is shown. A wordline drive circuit 14 receives an access strobe or clock signal Stb and an Address decode signal, as are generally provided for accessing a storage array row during a access operation. However, in the test operations as disclosed in further detail below, one of the Stb or Address decode signal may be set to a fixed (enabled) value so that the cell access timing with respect to the other signal, which is pulsed or included in a ring oscillator signal path. The wordline drive circuit receives two power supply rail inputs, a primary supply input $V_{DD}$ and a wordline drive supply input $V_{OD}$ for simulating a access overdrive voltage and/or determining whether or not overdrive is required. The output of the wordline drive circuit 14 is connected to a wordline that is either an actual storage array wordline, or is a test wordline that matches an actual storage array wordline in impedance and propagation characteristics. Between wordline segments 11, storage cells 10 are attached to the wordline, which are shown as dummy cells with both bitlines connected to the positive power supply rail ($V_{DD}$), but in a production circuit may be actual storage cells 10 connected to bitlines connected to suitable data circuits. Since, in the test methods described below, storage cells 10 will remain disabled, it is not necessary to connect storage cells 10 to bitlines or supply them with data.

Figure 1B:
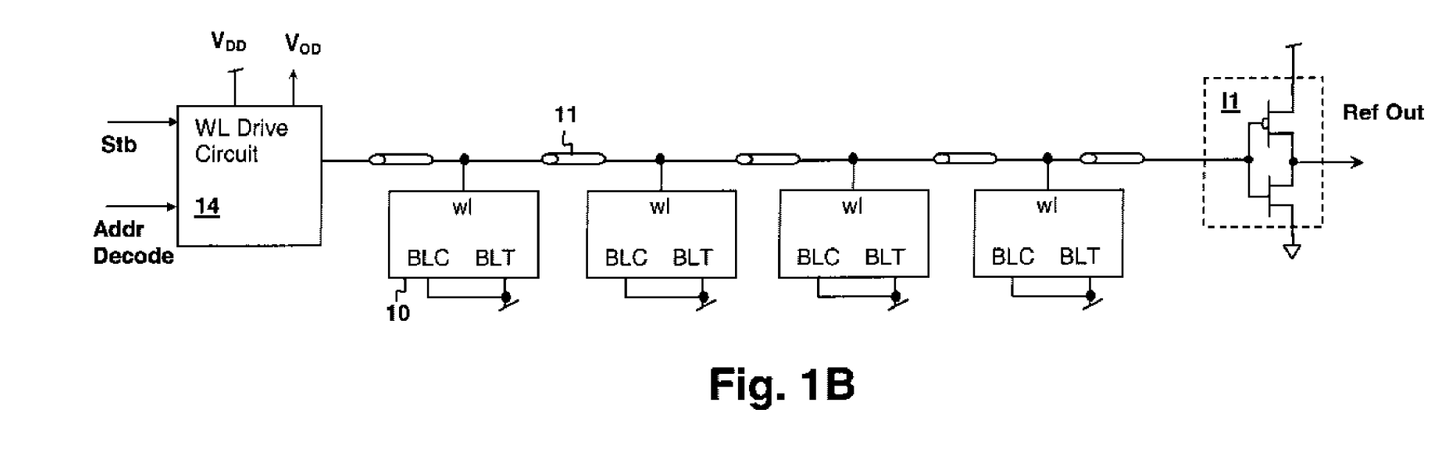
FIG. 1B is a simplified schematic diagram of a reference memory cell test row in accordance with an embodiment of the invention.

The end of the wordline in the row circuit of FIG. 1A is connected to the input of a sense circuit 12 in accordance with an embodiment of the present invention. Sense circuit 12 provides a sense output signal Sense Out that accurately reflects that actual state change in a cell identical to storage cells 10, if there were a storage cell connected in place of sense circuit 12. Variations in the delay for each state change direction of sense output signal Sense Out for operating condition variations such as changes in $V_{DD}$ or $V_{OD}$ reflect changes in the internal access delay of storage cells 10 as well as writeability of storage cells 10. Absolute delay of output signal Sense Out can be determined with respect to a reference row circuit, as shown in FIG. 1B. The reference row circuit is identical to the test row circuit of FIG. 1A, but rather than sense circuit 12, an inverter I1 receives the wordline signal at the end position and provides a buffered output signal Ref Out. Output signal Sense Out can be compared directly with output signal Ref Out, or ring oscillators can be constructed with test row circuits as depicted in FIG. 1A and reference row circuits as depicted in FIG. 1B and their oscillating frequencies compared to determine the delay difference due to the access delay of the sense circuit 10, which is the delay from the arrival of the wordline transition at the storage cell to the change in state within the storage cell, a value that cannot be typically measured in an actual storage cell circuit. By cascading a large number of rows and optionally forming a ring oscillator, the overall delay can be multiplied by the number of rows, increasing the potential resolution of the measurement, since a single delay is on the order of picoseconds in present-day storage cell technology.

Figure 2:
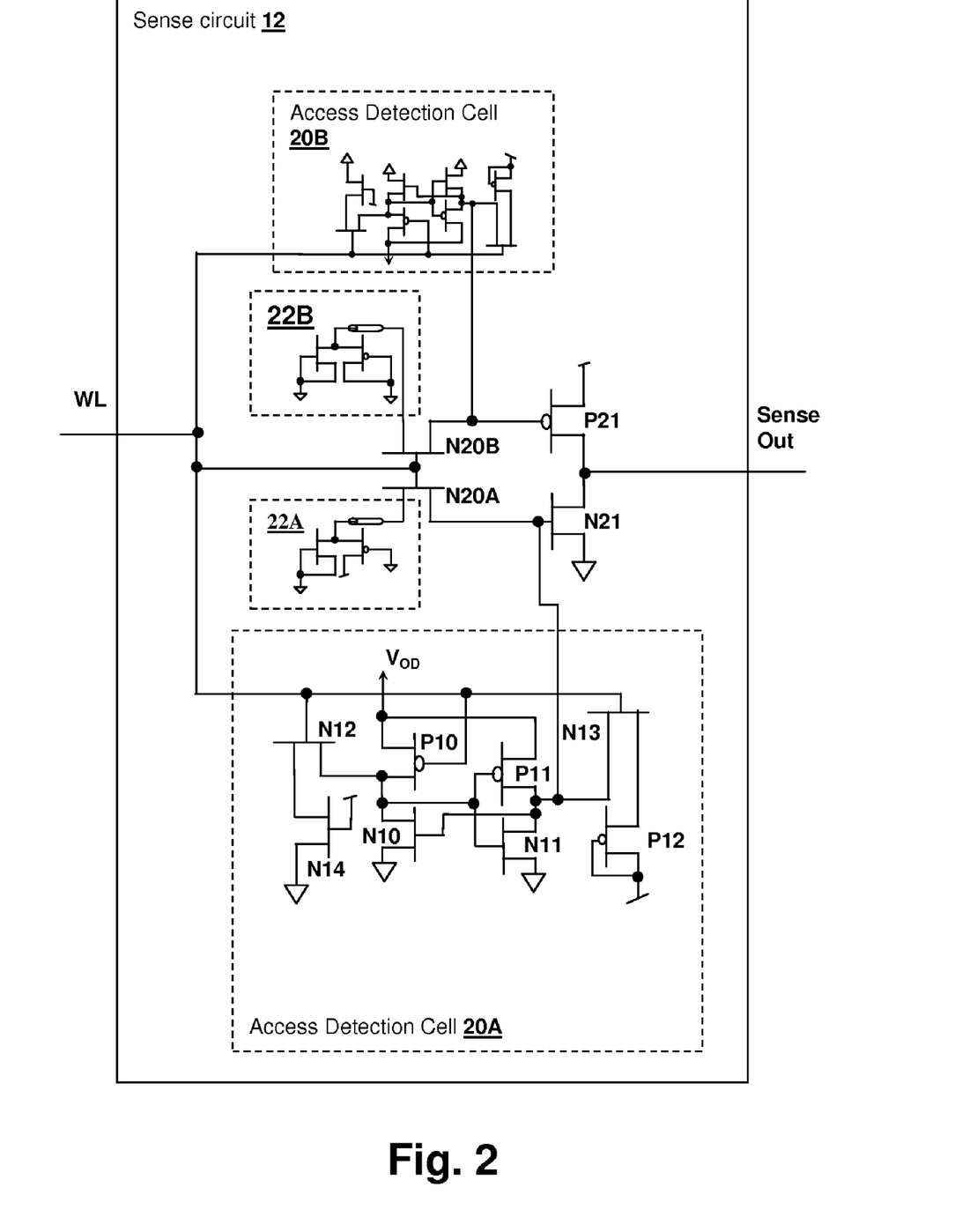
FIG. 2 is a schematic diagram depicting details of sense circuit 12 of FIG. 1A, in accordance with an embodiment of the invention.

Referring now to FIG. 2, details of sense circuit 12 of FIG. 1A is shown in accordance with an embodiment of the invention. Sense circuit 12 includes at least one access detection cell 20A, which is almost identical to an actual storage cell 10. In the depicted embodiment, the type of storage cell 10 is 6T, with a pair of cross-coupled inverters having input/output terminals connected to a pair of bitline pass transistors, a type of storage cell that is well-known in the art. However, in the present invention, sensing of a access transition is provided in access detection cell 20A by coupling the output of the inverter formed by transistors P11 and N11 to the gate of N-channel transistor N10, but not to the gate of P-channel transistor P11. The gate of P-channel transistor P10 is connected to the wordline signal WL, rather than the output of the inverter formed by transistors P11 and N11. Access detection cell 20A circuit is otherwise configured as a 6T storage cell. The access detection cell 20A passgate transistors N12 and N13 are connected to transistors P12 and N14, which simulate bitline write drivers and could alternatively be supplied by actual bitlines with write driver circuits. The output of access detection cell 20A is taken from the output of the inverter formed by transistors P11 and N11, and provides the gate input to transistor N21B, which causes the falling direction transition of the Sense Out signal when transistor N21B is activated.

The operation of access detection cell 20A is such that prior to access detection cell 22A being enabled, wordline signal WL is at a low voltage level and transistor P10 is conducting, forcing the input of the inverter formed by transistors P11 and N11 to be at a high voltage level ($V_{DD}$). When wordline signal WL transitions from low voltage (ground) to high voltage ($V_{OD}$), pass transistors N12 and N13 in access detection cell 20A are enabled, forcing the input of the inverter formed by transistors P11 and N11 to ground, which causes the inverter output to rise, turning on transistor N10. Transistor N10 turns off transistor N21, previously enabled by the wordline signal WL applied to transistor N20A, which coupled a pre-charge circuit 22A that pulls up the gate of transistor N21 to duplicate the conditions that appear on wordlines of storage cells 10. Thus the rising transition at the output of transistor N21 is reflective of the end of the total state change within access detection cell 20A under actual loading and operating conditions of storage cells 10.

The above-described action of access detection cell 20A can be viewed as a one-shot "delay" imposed on the gate of transistor N21 with respect to the alternative connection of wordline signal WL to the input of inverter I1 as in the reference row circuit of FIG. 1B. The "delay" is that of a state change due to an access to access detection cell 20A. In order to increase the effective delay and/or difference of a ring oscillator period as between the reference row circuit of FIG. 1B and the test row circuit of FIG. 1A, another optional access detection cell 20B, along with another optional pre-charge circuit 22B and associated pass transistor N20B can be added to further delay the falling transition of the Sense Out signal, by delaying the de-activation of transistor P21. When wordline signal WL is raised to a high-voltage level, access detection cell 20B holds transistor P21 on until the internal state of access detection cell 20B has changed. Otherwise, wordline signal WL can be connected directly to the gate of transistor P21.

Figure 3:
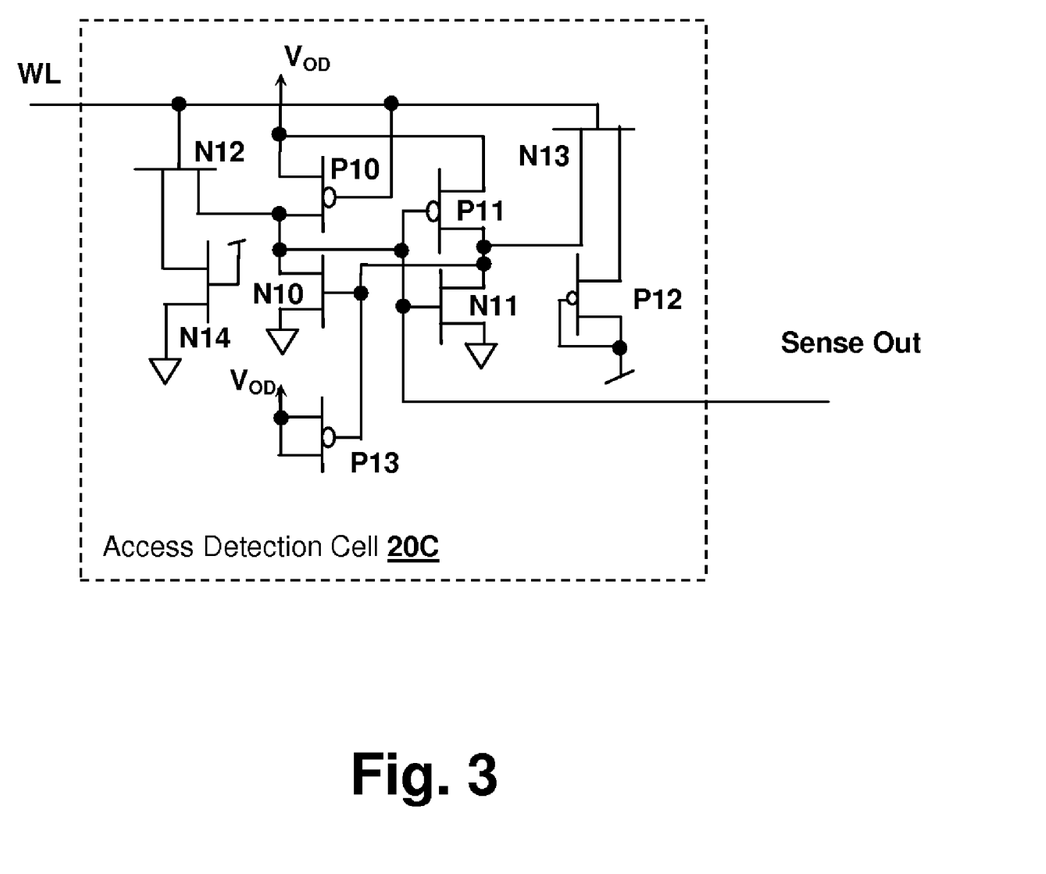
FIG. 3 is a schematic diagram depicting details of an access detection cell 20C that may be used to provide sense circuit 12 of FIG. 1A in accordance with another embodiment of the invention.

Referring now to FIG. 3, details of a sense circuit in accordance with another embodiment of the invention are shown. The alternative sense circuit has a structure and operation similar to access detection cells 20A of FIG. 2, and therefore only differences between them will be described below. In the depicted embodiment, a single access detection cell 20C, provides the Sense Out signal directly from the input of the inverter formed by transistors P11 and N11, omitting pre-charge circuit 22A and transistor N21 of access detection cell 20A of FIG. 2, and connecting a transistor P13 that simulates the loading that would otherwise be provided by the gate of transistor P10 in an ordinary cross-coupled inverter circuit. Therefore the timing of the Sense Out signal reflects that of an actual cell in the array.

Figure 4:
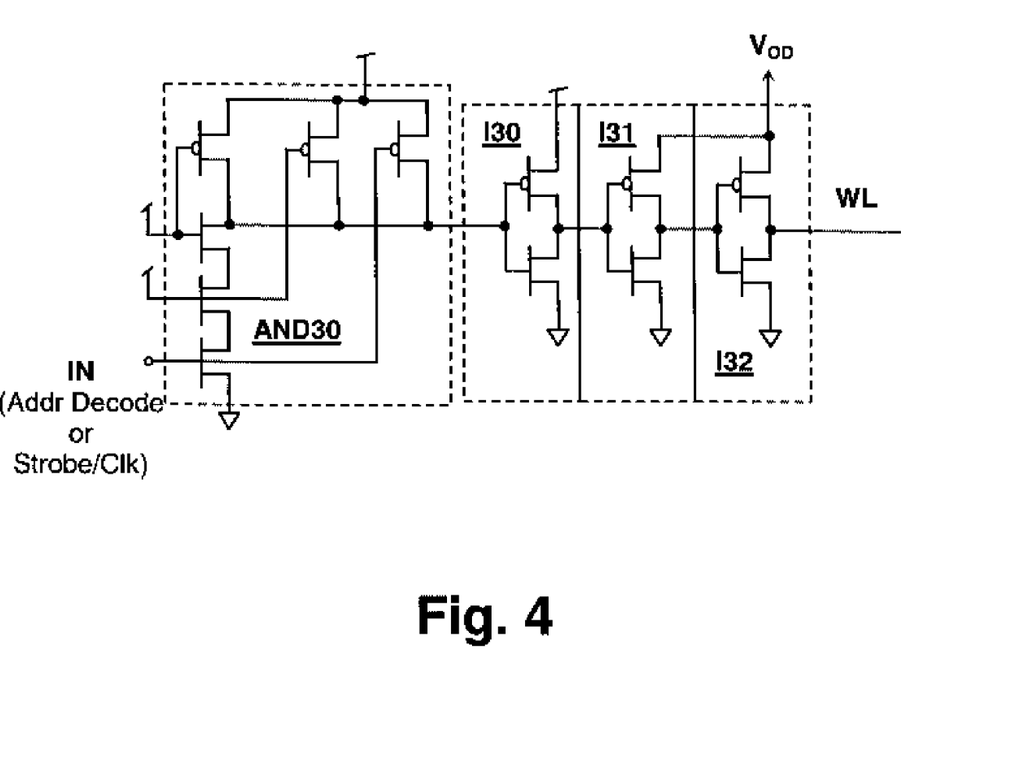
FIG. 4 is a schematic diagram depicting details of wordline drive circuit 14 of FIG. 1A.

Referring now to FIG. 4, details of wordline drive circuit 14 of FIG. 1A and FIG. 1B are depicted. A static logical AND gate AND30 receives an input signal that may be the address decode or clock/access strobe signal and activates wordline signal WL via a series of cascaded inverters I30-I32 that implement a wordline drive circuit. Inverters I31 and I32 are supplied from overdrive power supply rail $V_{OD}$, which may be varied as part of the test, as mentioned above, to determine if access overdrive is required and an overdrive voltage level. While only one input of logical AND gate AND30 is provided with an input signal in the depicted circuit and the others are wired in an enabled configuration, it is understood that the other inputs can be connected to signals as provided in an operational array configuration, such as one input receiving a clock, another a write signal and the third an address decode signal.

Figure 5:
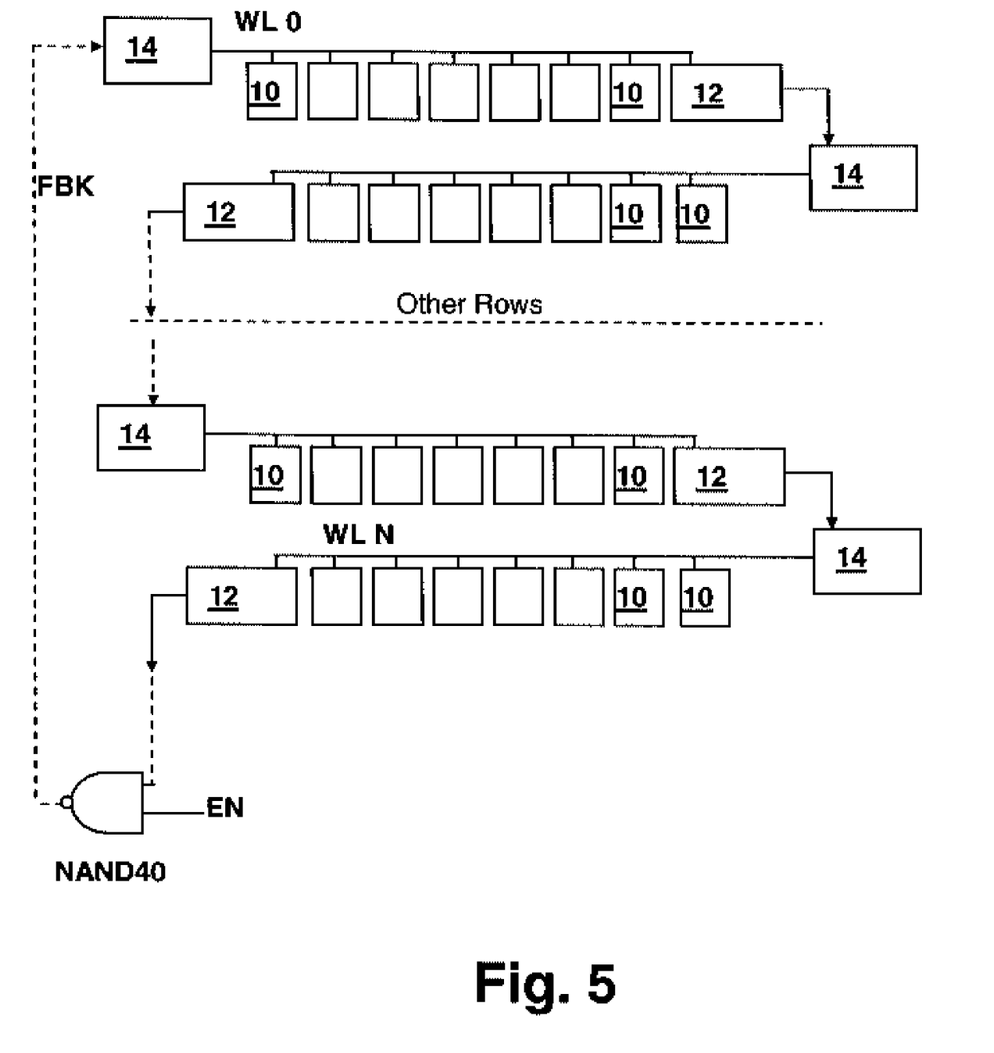
FIG. 5 is a block diagram depicting a test memory array in accordance with an embodiment of the invention.

Referring now to FIG. 5, details of an array circuit wired in a delay chain and optionally a ring oscillator are depicted. As shown, each row circuit is implemented as shown in FIG. 1A, but the wordline driver circuits 14 and sense circuit 12 are at opposite physical ends of the wordlines for alternate storage array rows. Since the logical sense from the input of wordline driver 14 to the output of sense circuit 12 is a net inversion, either an odd number of rows should be connected to form a ring oscillator via optional feedback path FBK or another inversion must be added to the chain, for example, logical NAND gate NAND40 provides such an inversion, along with an enable input EN for activating oscillation. Multiple sub-arrays within a large array may also be connected in the ring or delay chain, or alternatively a reference ring may be implemented in one sub-array and the test ring in another.

Figure 6A:
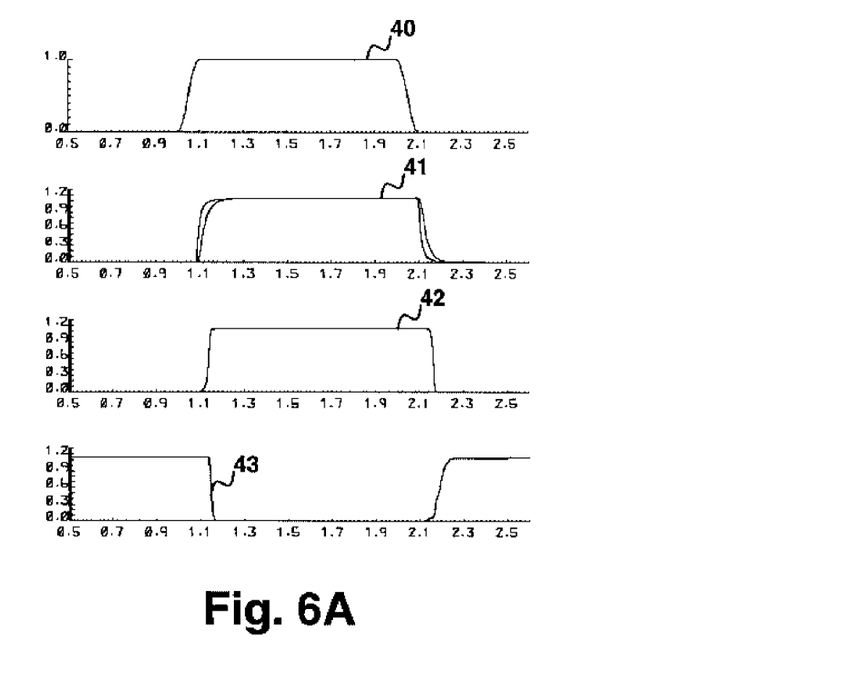
FIGS. 6A and 6B are time-voltage diagrams depicting signals within the memory cell test row of FIG. 1A.
Figure 6B:
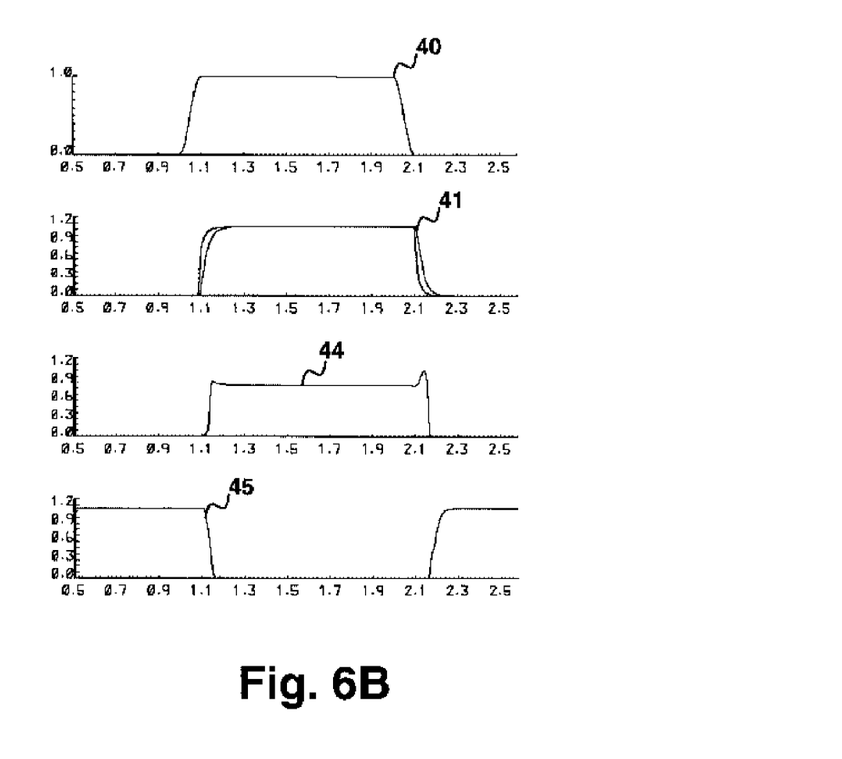

Referring now to FIG. 6A and FIG. 6B, operation of the test row circuit of FIG. 1A is illustrated as simulation results in a time-voltage diagram. In FIG. 6A, wordline signal WL is shown as waveform 40. In response to the arrival of the rising edge of WL at the sense circuit 12, depicted as waveforms 41, the internal state of access detection cell 20A is shown as waveform 42 as presented to the gate of transistor N21A. Waveform 43 shows the output of sense circuit 12 and the difference in delay between the rising edge of waveform 40 and the falling edge of waveform 43 and the delay through the reference row circuit of FIG. 1B (not shown) yields the wordline-to-cell access delay. FIG. 6B shows the voltage of the internal node with no overdrive as waveform 44, which is one threshold voltage below $V_{DD}$ during most of the write interval and waveform 45 again shows the output of sense circuit 12. If overdrive were required for writeability of storage cells 10 waveforms 44 and 45 could show no transition due to non-writeability at $V_{OD}=V_{DD}$, a condition that can occur when the threshold voltage of pass transistors (e.g., transistors N12 and N13 of FIG. 2) is too high.

Figure 7:
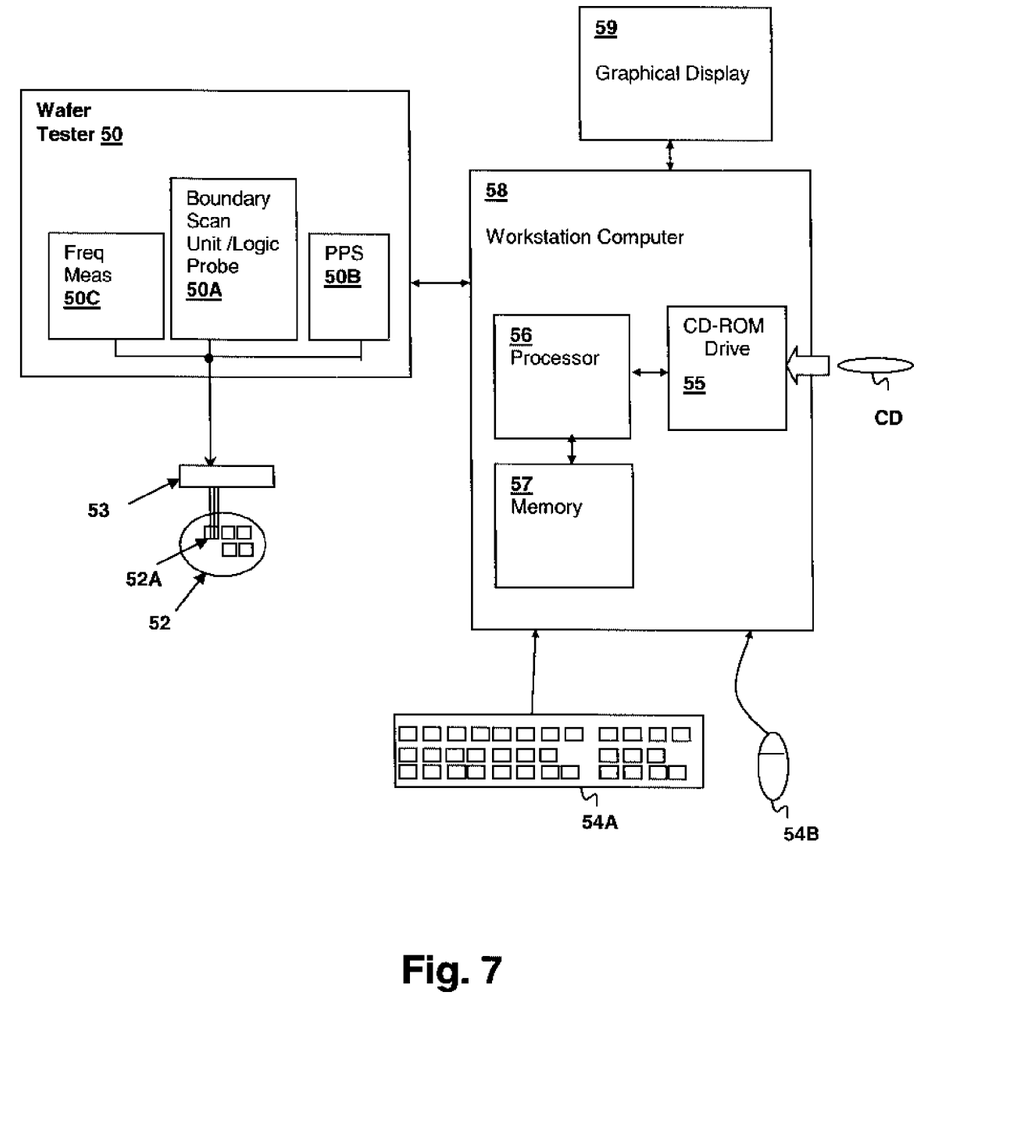
FIG. 7 is a wafer test system in which a method according to the present invention is practiced.

Referring now to FIG. 7, a VLSI wafer test system, in which methods according to an embodiment of the present invention are performed, is depicted. A wafer tester 50 includes a boundary scan unit 50A for providing stimulus to and retrieving data from a die 52A on a wafer under test 52 via a probe head 53 having electrical test connections to die 52A. Wafer tester 50 includes a frequency or delay measurement unit 50C, that evaluates a frequency of the ring oscillator or delay implemented by the test row and reference row of storage cells 10 in conjunction with wordline drivers 14 and sense circuit 12. Wafer tester 50 also includes a programmable power supply 50B for supplying power supply rail voltages $V_{DD}$ and $V_{OD}$ so that the overdrive and storage cell supply voltage can be varied during testing.

A workstation computer 58, having a processor 56 coupled to a memory 57, for executing program instructions from memory 57, wherein the program instructions include program instructions for receiving data from wafer tester 50 and/or circuits within wafer 52 in accordance with an embodiment of the present invention, is coupled to wafer tester 50. Generally the methods of the present invention either enable the reference and test ring counters, count their frequency of oscillation, subtract the results and divide by the number of rows in the rings to obtain the true access delay. Alternatively, a similar delay measurement is performed by stimulating the reference and test delay chain, measuring the delay times and subtracting the results, and dividing by the number of rows. Counters may be included within the die circuits to count the frequency or measure the delay, or the frequency/delay counters may be located in wafer tester 50. Program instructions obtain the counts from wafer tester 50 or read the counts from wafer 52, then process the counts to obtain the cell access delay and/or determine whether the cells are writeable under the currently-set operating conditions. The program instructions may be loaded from a storage media such as optical disc CD via a CD-ROM drive 55 or other suitable optical or magnetic/non-volatile memory drive. The data produced by embodiments of the present invention are collected from multiple ring oscillator or delay tests of storage cells 10 within dies 52A as one or more of the power supply voltages are varied by programmable power supply 50B The results of all of the measurements can then be evaluated to either change the design of the array or storage cells 10, determine whether fabrication process has deviated exceedingly from tolerable norms or to determine operational ranges such as power supply voltage tolerances and access cycle times.

Data from ring oscillator/delay line tests in accordance with embodiments of the invention are transferred to workstation computer 58 via wafer tester 50 and stored in memory 57 and/or other media storage such as a hard disk. Workstation computer 58 is also coupled to a graphical display 59 for displaying program output such as the results of memory tests described hereinafter. Workstation computer 58 is further coupled to input devices such as a mouse 54B and a keyboard 54A for receiving user input. Workstation computer 58 may be coupled to a public network such as the Internet, or may be a private network such as the various "intra-nets" and software containing program instructions for analyzing data produced by methods and circuits in accordance with embodiments of the present invention may be located on remote computers or locally within workstation computer 58. Further, workstation computer 58 may be coupled to wafer tester 50 by such a network connection.

While the system of FIG. 7 depicts a configuration suitable for sequential test of a plurality of dies on a wafer, the depicted system is illustrative and not limiting to the present invention. Probe head 53 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 52, or applied to circuits implemented in fully functional dies where data extraction is performed over a serial or parallel bus or other interface.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method for measuring characteristics of a storage array, said method comprising:
propagating a wordline select pulse along a wordline select signal path of a row circuit of said storage away to an output driver circuit;
delaying said wordline select pulse by using a access detection cell that holds an input of said output driver circuit until a simulated access operation activated by said pulse has completed in said access detection cell, wherein the delaying is performed by presetting a state of an inverter in said access detection cell in response to an inactive state of said wordline select signal using a preset circuit, disabling said preset circuit in response to said pulse, and forcing an output of said inverter in response to said pulse through a pass transistor connected to said output of said inverter, whereby said output of said inverter has a loading equivalent to that of an input of said inverter to simulate a access to a storage cell of said storage array.

2. The method of claim 1, further comprising:
varying a voltage of said pulse and said presetting; and
observing an effect of said varying on success and delay time of said forcing to determine writeability and access delay of said storage cell of said storage array.

* * * * *